United States Patent
Declerck

(10) Patent No.: US 9,331,232 B2
(45) Date of Patent: May 3, 2016

(54) PROCESS FOR ANNEALING PHOTOVOLTAIC ENCAPSULATION POLYMER FILM

(75) Inventor: Johan Willy Declerck, Puurs (BE)

(73) Assignee: NOVOPOLYMERS N.V., Puurs (BE)

(*) Notice: Subject to any disclaimer, the term of this patent is extended or adjusted under 35 U.S.C. 154(b) by 0 days.

(21) Appl. No.: 13/878,785

(22) PCT Filed: Oct. 11, 2010

(86) PCT No.: PCT/EP2010/006190
§ 371 (c)(1),
(2), (4) Date: Jun. 17, 2013

(87) PCT Pub. No.: WO2012/048715
PCT Pub. Date: Apr. 19, 2012

(65) Prior Publication Data
US 2013/0273685 A1 Oct. 17, 2013

(51) Int. Cl.
| | | |
|---|---|---|
| *H01L 21/00* | (2006.01) | |
| *H01L 31/18* | (2006.01) | |
| *B32B 17/10* | (2006.01) | |

(Continued)

(52) U.S. Cl.
CPC ........ *H01L 31/1876* (2013.01); *B29C 47/0021* (2013.01); *B29C 47/0057* (2013.01); *B29C 71/02* (2013.01); *B32B 17/1055* (2013.01); *B32B 17/10788* (2013.01); *B32B 17/10981* (2013.01); *H01L 31/048* (2013.01); *H01L 31/0481* (2013.01); *B29C 47/92* (2013.01); *B29C 2035/0822* (2013.01); *B29C 2071/022* (2013.01); *B29C 2947/926* (2013.01); *B29C 2947/92514* (2013.01); *B29C 2947/92704* (2013.01); *B29K 2021/003* (2013.01); *B32B 2457/12* (2013.01); *Y02E 10/50* (2013.01)

(58) Field of Classification Search
CPC ............................................. H01L 2924/01079
See application file for complete search history.

(56) References Cited

U.S. PATENT DOCUMENTS

| | | | | |
|---|---|---|---|---|
| 5,861,324 A | * | 1/1999 | Ichinose | ......... H01L 31/022425 136/256 |
| 7,488,894 B2 | * | 2/2009 | Iijima | ....................... 174/117 A |

(Continued)

FOREIGN PATENT DOCUMENTS

| | | |
|---|---|---|
| CN | 1131824 A | 9/1996 |
| CN | 101273465 A | 9/2008 |

(Continued)

OTHER PUBLICATIONS

Chang et al., Organic Electronics, 10(7):1300-1306 (2009). "Thin-film encapsulation of polymer-based bulk-heterojunction photovoltaic cells by atomic layer deposition.".

(Continued)

*Primary Examiner* — Zandra Smith
*Assistant Examiner* — Andre' C Stevenson
(74) *Attorney, Agent, or Firm* — Nixon Peabody LLP

(57) ABSTRACT

A process for annealing photovoltaic polymer encapsulation film (3), the film comprising polymer molecules substantially oriented along a machine direction, characterized in that the film is heated, supported on a support surface of support means (12), with heating means to a relaxation temperature to increase the isotropy of the polymer molecules such that the film is at least partly annealed, the support means (12) comprising a fluid (13) between the film (3) and the support surface.

12 Claims, 3 Drawing Sheets

(51) Int. Cl.
*H01L 31/048* (2014.01)
*B29C 71/02* (2006.01)
*B29C 47/00* (2006.01)
*B29K 21/00* (2006.01)
*B29C 47/92* (2006.01)
*B29C 35/08* (2006.01)

(56) References Cited

U.S. PATENT DOCUMENTS

| | | | |
|---|---|---|---|
| 8,227,024 B2* | 7/2012 | Borovkov et al. | 427/145 |
| 8,475,891 B2* | 7/2013 | Shiina et al. | 428/32.17 |
| 2007/0295388 A1* | 12/2007 | Adriani | B32B 17/1077 136/251 |
| 2009/0139564 A1 | 6/2009 | Miyaji et al. | |
| 2009/0278277 A1 | 11/2009 | Gong et al. | |
| 2010/0029827 A1* | 2/2010 | Ansems et al. | 524/451 |
| 2010/0126558 A1* | 5/2010 | Samuels et al. | 136/251 |
| 2011/0057351 A1 | 3/2011 | Miyaji et al. | |

FOREIGN PATENT DOCUMENTS

| | | |
|---|---|---|
| CN | 101821092 A | 9/2010 |
| EP | 1 930 953 | 6/2008 |
| EP | 2 001 056 | 12/2008 |
| WO | 2003/007399 | 1/2003 |
| WO | 2010/062708 | 6/2010 |

OTHER PUBLICATIONS

Bormann, Joachim, "Green EVA extrusion line for encapsulation film" Press Release, Apr. 28, 2011. Retrieved from the Internet: http://www.solar-pv-management.com/awards_nomination_uploads/2011-04-28%20EVA%20Extrusion%20lines%20lines%20for%20PV%20applications.pdf (retrieved on Aug. 10, 2011).

Office Action in corresponding Korean Application No. 10-2013-7011487 mailed Jul. 26, 2014 (with translation).

Office Action in corresponding Chinese Application No. 201080069554.7 dated May 26, 2015 (with English Translation).

* cited by examiner

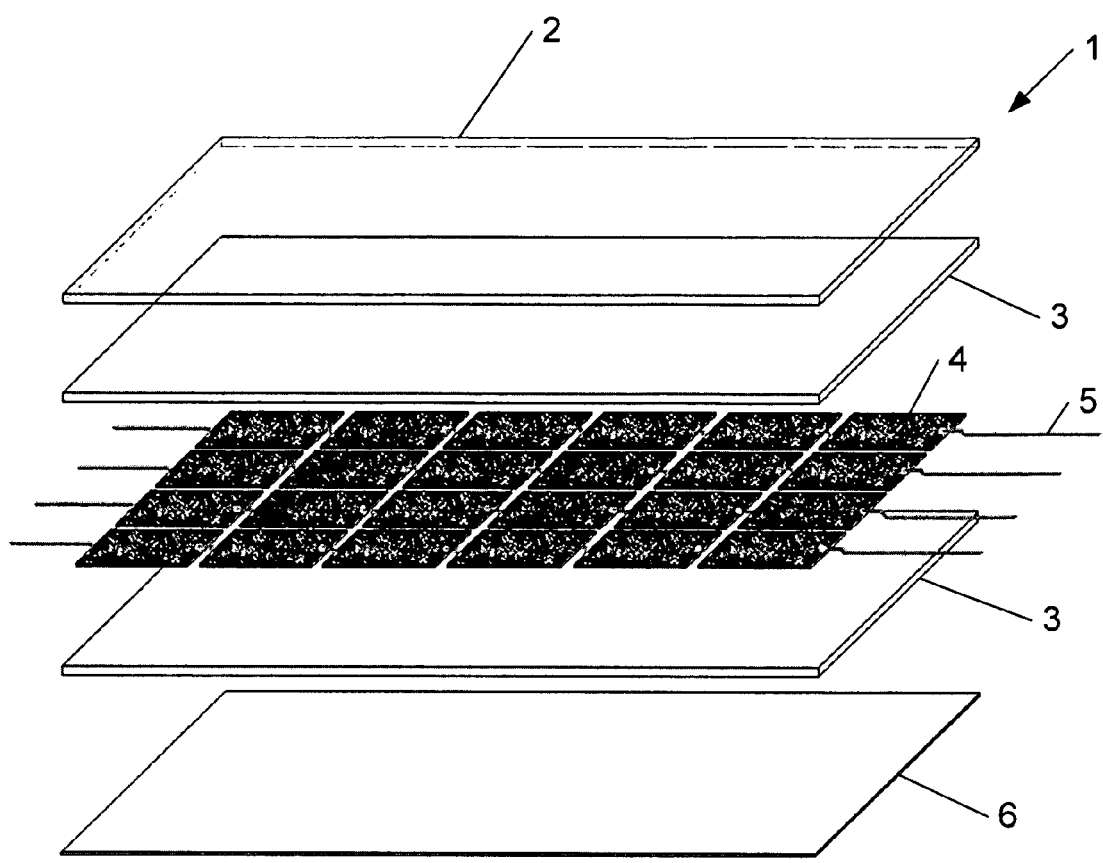
*Fig. 1*
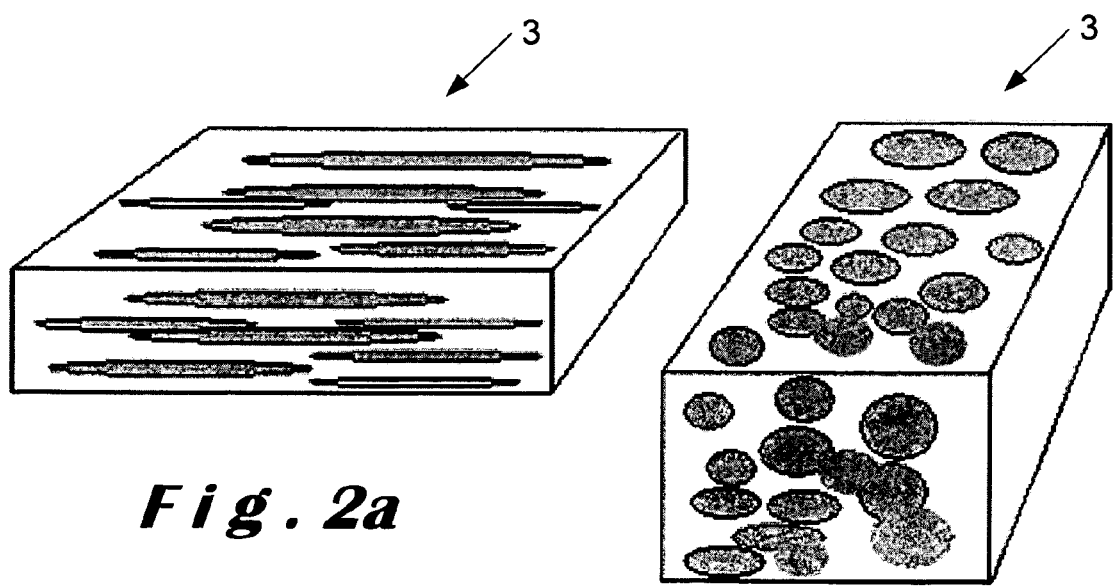
*Fig. 2a*  *Fig. 2b*

PROCESS FOR ANNEALING PHOTOVOLTAIC ENCAPSULATION POLYMER FILM

CROSS REFERENCE TO RELATED APPLICATIONS

This application is a 35 U.S.C. §371 National Phase Entry Application of International Application No. PCT/EP2010/006190 filed Oct. 11, 2010, which designates the U.S., and the contents of which are incorporated herein by reference in its entirety.

The current invention relates to a process for annealing photovoltaic polymer encapsulation film, comprising polymer molecules substantially oriented along a machine direction, according to the preamble of the first claim.

Polymers, converted into films by means of conventional polymer extrusion technology, at high output rates (>5-7 m/min) and at thin gauge (for instance 500 microns or less), have a high level of orientation along a machine direction, being the direction of extrusion of the film out of the machine. One of the consequences of this high level of orientation is high shrinkage when such film is heated up above its melting temperature. Especially for photovoltaic polymer encapsulation film when solar cells arrays are encapsulated into photovoltaic modules with such a film, this is an issue. Shrinking may cause damage to the brittle solar cells and/or may result in lack of material at the edges or in the modules. It has been found that a separate annealing step prior to the lamination step where the encapsulation is taking place by for instance a vacuum lamination process where the film is heated up to melt and may also be further heated up to allow curing or cross link of the polymer matrix, allows to relax the film and hence to significantly reduce the shrinkage at the point of lamination. An annealed photovoltaic polymer encapsulation film with reduced shrinkage is present on the market, under the trademark PHOTOCAP, manufactured by STR. Information about the process to obtain this film has however not been disclosed to the public. However, this film manufactured by STR is sold attached to a siliconised paper and if the siliconised paper is removed, a microscopic imprint of the paper is visible in the film. Due to the presence of this siliconised paper, a silicon transfer from the paper to the film is observed, which is not desired. Moreover, the presence of the siliconised paper causes an additional cost of material and an additional process step, i.e. removal of the paper, must be performed when applying the film into a photovoltaic module.

Although the orientation and stress of the polymer molecules can be reduced to a limited extend, for instance by slow speed extrusion, slow cooling of the extruded film and limited extension of the melt curtain after extrusion, by smart processing during conventional extrusion, this solution comes at the considerable cost of slowing down the production process. Without proper means to anneal the film after extrusion, the speed of extrusion is limited to 100 to 250 kg for a film of the type high vinylacetate EVA copolymer of approximately 500 microns thick and 1000 mm wide. The resulting stress and hence shrink of this type of film is high.

It is an object of the present invention to provide a process for annealing photovoltaic polymer encapsulation film in which the shrinkage of the film is reduced.

Thereto, the film is heated, supported on a support surface of support means, with heating means to a relaxation temperature to increase the isotropy of the polymer molecules such that the film is at least partly annealed, the support means comprising a fluid between the film and the support surface.

The inventor has found that the film can be annealed by heating the film to the relaxation temperature. The fluid contained between the film and the support surface prevents the film, which usually is a thin gauge film of for example 500 micrometer or less, to stick to the remainder of the support.

The inventor has moreover found that the isotropy of the polymer molecules can for example be increased at the relaxation temperature or above the relaxation temperature by the polymer molecules reorienting with respect to the machine direction such that a more uniform distribution of an angle of orientation with respect to the machine direction can be obtained and/or by assuming a random coil configuration increasing isotropy of the polymer molecules.

In preferred embodiments according to the invention, the support surface has a rough surface for supporting the film. The surface topography of a rough surface, with its elevations and depressions, is such that it offers an improved support to the heated sticky polymer film. Without wanting to be bound by any theory, the inventor believes that the combination of elevations to immobilize the film in discrete points, and depressions, where the fluid supports the film, prevents the film from sticking, flowing or elongating significantly during relaxation. It has a further advantage that the stress relaxation is evenly distributed over the polymer film. A random distribution of the elevations and depressions is also believed to contribute to a further increase of the isotropy of the polymer molecules in the film.

In preferred embodiments according to the invention, the rough surface has a roughness Rz between 50 and 120 microns, preferably 90 microns and/or a roughness Ra between 5 and 50 microns. The inventor has found that the advantages of having a support surface with a rough surface, i.e. the balance between the effect of the elevations and depressions described above, are particularly marked in the case of a surface with this particular micro-topography.

In more preferred embodiments according to the invention, the rough surface is made of metal, such as for example steel, stainless steel, ceramics, copper, aluminium etc. The metal surfaces are in general very durable and do not react with polymers in the temperature ranges relevant for polymer film relaxation. Furthermore, a wide variety of surface roughening techniques exists, to apply a particular roughness to the surface, especially a metal surface.

In preferred embodiments according to the invention, the support means comprise, preferably are at least one roll with the rough surface as outer cylindrical surface. A roll with the rough surface as outer cylindrical surface does not only provide a surface to hold the film, it offers also the possibility to transport the difficult to handle, heated, sticky soft film, from one process station to the other, by rotating the roll around its longitudinal axis, as a part of an automated and continuous production process.

In preferred embodiments according to the invention, the film comprises functional molecules and the relaxation temperature is below the thermal decomposition temperature of the functional molecules. The functional molecules are for example curing molecules, such as for example organic peroxides, necessary for the curing process or primer molecules, such as for example silanes, for increasing the adhesion of the film to a glass surface, for example in a photovoltaic module.

In preferred embodiment according to the invention, the relaxation temperature is at least above the vicat softening point, and more preferably above the melting point. The relaxation temperature is kept above the vicat softening point, and more preferably above the melting point in order to obtain a more rapid relaxation of the polymer film and reducing the time of the overall annealing process. The result is an increased output of annealed polymer film and a reduced risk that undesired chemical reactions occur while maintaining the chemical stability of the polymer, in order not to alter the chemical, thermodynamical, mechanical and optical properties of the polymer film.

In preferred embodiments according to the invention, during annealing, the photovoltaic polymer encapsulation film, in the form of a continuous sheet, is fed over the support means by driving means, preferably at a speed of 8 m/min or higher of the photovoltaic polymer encapsulation film. The advantage of a process to anneal a continuous sheet of polymer film at high throughput speed is that such an annealing process is suited to be supplied with un-annealed polymer film by high production capacity extrusion machine, to produce a continuous sheet photovoltaic polymer encapsulation film, especially when the annealing is carried out on the outer cylindrical surface of a roll. Preferably, feeding of the film over the support means by the driving means is such as to avoid re-orientation of the polymer molecules, i.e. losing isotropy. More preferably, re-orientation of the polymer molecules, i.e. losing isotropy, is avoided in any subsequent treatment of the film, for example during further transport of the film by the driving means after annealing of the film. For example, this can be achieved by avoiding tension in the film during transport of the film by the driving means.

In preferred embodiments according to the invention, after annealing, the film is cured in a separate step, preferably after annealing the film and more preferably after cooling the film to room temperature such as to form a half-fabricate. Curing the polymer film hardens and toughens the film and dimensionally freezes the film and the components that are encapsulated by the film. This creates an elastic material (rubber) which cannot melt any more after encapsulation.

In preferred embodiment according to the invention, the heating means comprise infra-red heating elements. The infra-red heating elements allow for a rapid and uniform heating of the polymer film. A further advantage of infra-red heating elements is their rapid response time to the power control unit. The possibility to quickly increase/decrease power enables very accurate heating and temperature control. Especially when annealing is carried out on the outer cylindrical surface of a roll and the infra-red heating elements are placed radially along the outer surface of the roll, very accurate temperature control can be achieved, adjusted to the rotational speed of the roll.

In preferred embodiments according to the invention, the polymer film is made of a thermoplast elastomer material such as but not limited to polyvinylbutyral (PVB), styrene-ethylene-butylene-styrene (SEBS), styrene-ethylene-propylene-styrene (SEPS), polymethylmethacrylate-acrylate copolymer, metalocene polyethylene, thermoplast polyurethanes, and other thermoplastic rubbers, polyolefins or functionalised polyolefins. These materials, alone or in combination have been selected in order to obtain films with specific properties, such as good optical properties, elasticity, barrier properties, etc. The polymer is transparent, has a suitable absorption and reflection of light and exhibits adhesive and elastic properties.

In preferred embodiments according to the invention, the polymer film is made of a functionalized polyolefin of the type ethylene vinylacetate (EVA). Certain EVA grades are very transparent, elastic, and can have a high-melt flow index and a low melting temperature and low thermal expansion, making it particularly suitable for encapsulating photovoltaic devices.

In preferred embodiments according to the invention, the EVA has a vinyl-acetate concentration between 28% and 40%. EVA with a vinyl-acetate concentration between 28% and 40% has improved transparency over ethylene monopolymer while keeping the melting temperature relatively low.

The invention also relates to a process for producing an annealed photovoltaic polymer encapsulation film, comprising the steps of producing the photovoltaic polymer encapsulation film by extrusion along an extrusion direction, the film comprising polymer molecules substantially oriented along a machine direction along the extrusion direction and annealing the thus obtained photovoltaic polymer encapsulation film by one of the processes described above.

The invention also relates to a photovoltaic polymer encapsulation film obtained by the previous process.

The inventor has found that a film obtained by this process can be substantially annealed; this means that it does not stretch, elongates, further orients or thins for example when cured as encapsulation film and is as such particularly suited to be used as an encapsulation film.

The invention also relates to a process for assembling solar cell arrays into photovoltaic modules by encapsulating the solar cell arrays with an annealed photovoltaic encapsulation film obtained the process according to the invention.

The inventor has found that, when encapsulating the solar cell arrays with an annealed photovoltaic encapsulation film according to the invention into photovoltaic modules, no substantial shrink stress is exerted on the solar cells during the melting phase, before the onset of the cure of the polymer. Therefore, low shrinkage prevents the cells from moving during the assembly, preferably by a flat bed vacuum lamination process, and prevents warp and/or stress on cells and ribbons and hence prevents cracks and hence costly failure during use.

The invention also relates to a photovoltaic module comprising the photovoltaic polymer encapsulation film obtained by the process according to the invention.

The invention also relates to an apparatus, specifically designed for carrying out the process according to the invention.

Other details and advantages of the process for annealing a photovoltaic polymer encapsulation film, the process for producing an annealed photovoltaic polymer encapsulation film, the photovoltaic encapsulation film obtained by this process, the process for assembling solar cell arrays into photovoltaic modules by encapsulating the solar cell arrays with an annealed photovoltaic encapsulation film and the photovoltaic module obtained by this process according to the invention will become apparent from the enclosed figures and the description of the preferred embodiments of the invention.

FIG. 1 shows an overview of a built-up of a photovoltaic module stack, according to the current invention;

FIG. 2 shows a schematic representation of polymer molecules in a photovoltaic encapsulation film, before annealing (a) and after annealing (b).

In the drawings a same reference number has been allocated to a same or analogous element.

Figure 3:
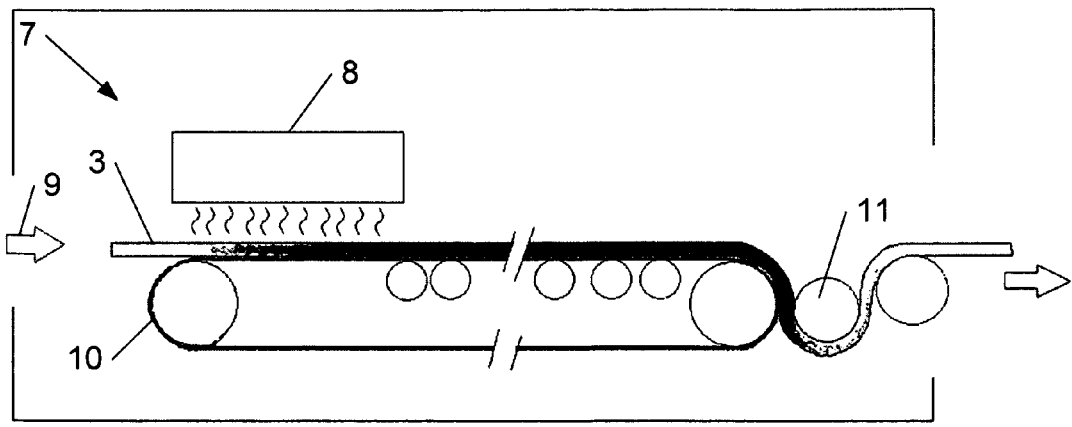
FIG. 3 shows a schematic representation of the process according to the current invention.

Solar cells arrays, for instance crystalline silicon solar cell arrays 4, are for example, assembled into photovoltaic modules 1, by connecting a series of solar cells by means of metal strips (ribbons) 5. The solar cells 4 are typically encapsulated with a photovoltaic polymer encapsulation film 3. FIG. 1 shows an example of a possible encapsulation of a photovoltaic module 1, comprising a rigid glass layer 2 (1 to 5 mm, preferably 2 to 4 mm), a first layer of photovoltaic polymer encapsulation film 3, 300 to 600 micrometer, preferably 400 to 500 micrometer thick, the solar cell array 4, connected by ribbons 5, a second layer of photovoltaic polymer encapsulation film 3, usually of an equal thickness as the first layer and an electrically isolating polymer-based back sheet 6.

The photovoltaic polymer encapsulation film 3 surrounds the solar cells 4 and the ribbon in the photovoltaic module 1. The module 1 is hermetically sealed from the outside by pulling a vacuum to remove all gases between the interfaces and then by heating the encapsulation film 3, by means of for instance a flat bed laminator, and the encapsulation film 3 is subsequently heated to a temperature just above its vicat softening point or just above its melting point and to a temperature to allow cross-linking of the polymer into a three-dimensional network.

A typical polymer can be a high vinyl acetate % ethylene vinyl acetate copolymer, with a melting point of for example 61 up to 75° C., containing for instance organic peroxides of the family of for example the dialkyl class of peroxides, the monoperoxy-carbonate type of peroxides or the peroxyketal type of peroxides or combinations thereof. All peroxides have a different thermal decomposition temperature profile, resulting, for a given temperature, in a different curing speed. Temperatures typically applied to cure such copolymers with such peroxides are in the range of 140 up to 160° C. Final curing is achieved when a three-dimensional network is formed, which cannot be dissolved by a solvent such as toluene or xylene in an extraction test. This state is also known as rubber. The polymer encapsulation film 3 cannot melt any more and the module 1 is hermetically closed.

Curing with the aid of curing molecules is however not critical for the invention and curing of the film can also be obtained using for example UV radiation. Next to curing molecules, the film can also comprise other molecules, such as primer molecules, fillers, stabilisers or antioxidants.

The cured encapsulation film will let the module 1 for example cope with impact and mechanical stresses such as expansions due to heat, without damaging the module (i.e. cracking of the cells, disconnection of the ribbons, and any other way that might disrupt the module) and protect the module 1 from moisture ingress.

The photovoltaic polymer encapsulation film 3 according to the present invention has a very low shrink rate and prevents shrink stress damage to the brittle solar cells 4.

Such photovoltaic polymer encapsulation film 3 is obtained by an annealing process, according to the present invention.

In general, any elastic transparent polymer may be used to produce the photovoltaic polymer encapsulation film, preferably a thermoplast elastomer material such as but not limited to polyvinylbutyral (PVB), styrene-ethylene-butylene-styrene (SEBS), styrene-ethylene-propylene-styrene (SEPS), polymethylmethacrylate-acrylate copolymer, metalocene polyethylene, thermoplast polyurethanes, and other thermoplastic rubbers, polyolefins or functionalised polyolefins. Particularly suitable are functionalized polyolefins of the type ethylene vinylacetate (EVA), especially EVA with a vinyl-acetate concentration between 28% and 40%. Examples of such type of materials available on the market are for example ELVAX® PV1400, EVATANE® 33-45 PV or, Escorene™ UL04331EL produced by DuPont, Arkema and ExxonMobile.

A highly elastic polymer can be converted into a film, for example by means of a conventional polymer extrusion process along a machine direction. Examples of such extrusion processes are for example cast extrusion, cast embossing, calendaring or the like. When such films 3 are made at high output rates (for example >5-7 m/min) at a thin gauge of 500 micron or less, such films 3 will typically have a high level of orientation of polymer molecules of the film in the machine direction. The machine direction is the direction parallel to the forward movement of the polymer film resulting from the extrusion process performed by an extruder. In the extrusion process the highly viscous polymer is for example forced to flow through narrow channels and/or through a narrow die gap (for example 100-700 microns) at high pressures (for example 60-300 bar), resulting in a high level of orientation and stress of the polymer molecules in the machine direction depending on the stresses and stretch ratios to which the polymer has been subjected during manufacturing and on the temperature of the polymer at the point of exit from the die.

FIG. 2 for example shows a schematic representation of (a) the polymer molecules under stress in the film 3 and (b) polymer molecules subjected to less stress. Annealing the film 3 according to the process provided by the present invention quickly and significantly reduces the shrinkage as described above and allows transforming a film as shown in (a) into a film as shown in (b). In the specific example shown, the polymer molecules of the film have a longitudinal shape before annealing the film and reorient to a so-called random-coil configuration shown in 2($b$).

Figure 4:
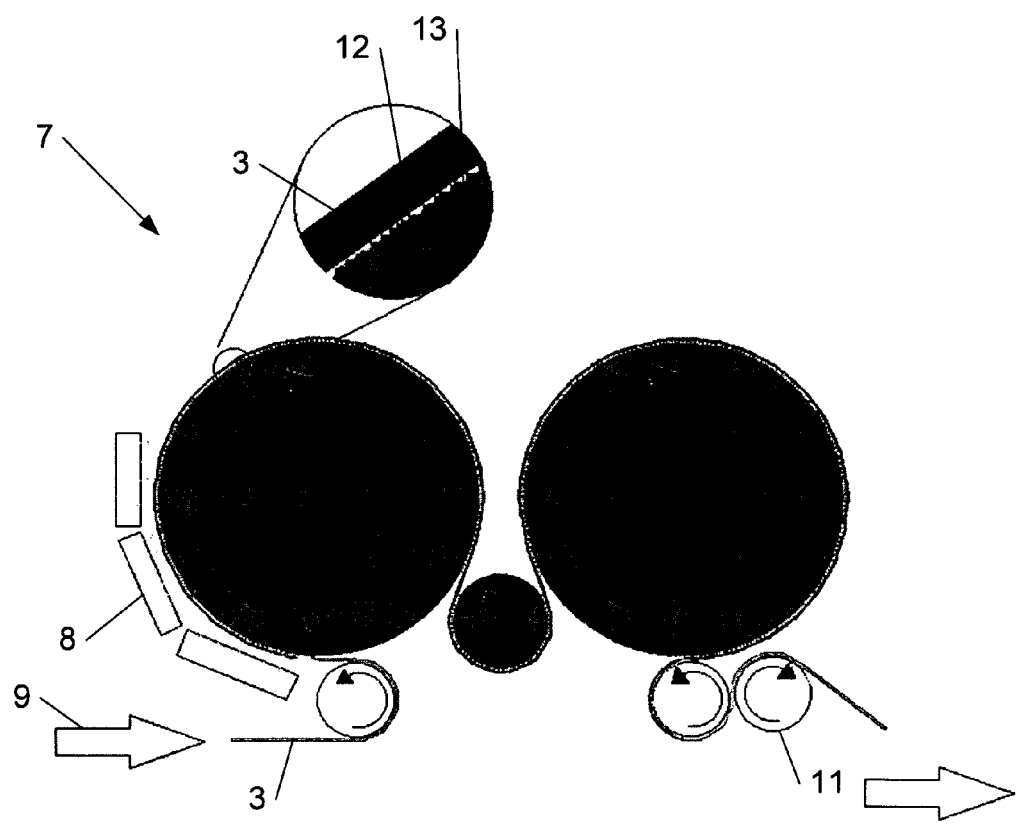
FIG. 4 shows a schematic representation of another embodiment of the process according to the present invention.

The annealing process according to the invention takes place in an annealing unit 7. The annealing unit 7 for example comprises driving means 10, to transport the polymer film through the annealing unit 7, heating means 8 to heat the polymer film to a relaxation temperature, a support surface of support means 12 on which the film is heated and optionally cooling means 11 by which the polymer film is cooled. FIG. 3 and FIG. 4 show two different preferred embodiments of an annealing unit 7 in which an annealing process according to the invention can take place. The driving means 10 in these particular embodiments are one or more rollers or conveyor belts but can also be combinations of both, the heating means 8 are for example infra-red heaters, the support surface 12 is for example a rough surface and the cooling means 11 for example a conventional chill roll. The different elements comprising the annealing unit 7 are discussed below.

After the extrusion step the polymer film is heated with heating means to a relaxation temperature such that the film is at least partly annealed. The heating of the polymer film 3 can be achieved by any heating means known to the person skilled in the art such as for example by conducting a heating liquid along the support surface 12, for example by conducting warm water along the support surface. The heating is preferably done by infrared heating elements 8. Infrared heaters 8 can be for example near wave infrared, medium wave infrared, far wave infrared or the like. The choice of the infrared wavelength and the type of generator will depend on the material that needs to be heated. Materials absorb a fraction of the infrared waves, reflect a fraction at the surface and allow a fraction to pass through. By selecting emitters with suitable spectra, the largest possible fraction of radiation is absorbed by the material and converted into heat. One further advantage of infrared heaters 8 is the quick on-off response time (the emitters of choice for this application can for example be switched off or on in 1 to 2 seconds). It is further possible to increase/decrease the power by simple power control units and pyrometers after the heating elements, allowing very accurate heating and temperature control and allows running at variable speed. The infrared heaters can be arranged in different manners depending on the embodiment of the annealing unit 7, as shown in FIGS. 3 and 4. For example, when annealing is carried out on the outer cylindrical surface of a roll as shown in FIG. 4, the infra-red heating elements are placed radially along the outer surface of the roll, when annealing is carried out on a conveyor belt as shown in FIG. 3, the infra-red heating elements are for example placed right above the conveyor belt carrying the film. The polymer encapsulation film 3 is for example presented to the annealing unit 7 at the film entrance point, the temperature of the film is either maintained if the temperature is high enough or raised by heating means, preferably ramped up, typically in less than 5 seconds, to a relaxation temperature, the temperature depending on the type of polymer used.

The encapsulation film is heated by the heating means to a relaxation temperature to increase the isotropy of the polymer molecules. The relaxation temperature is preferably above the vicat softening point. The vicat softening point is taken as the temperature at which the material is penetrated to a depth of 1 mm by a flat-ended needle with a 1 square mm circular or square cross-section. Standards to determine the vicat softening point include ASTM D 1525 and/or ISO 306, which are largely equivalent. The relaxation temperature is preferably below the thermal decomposition temperature of the functional molecules, if present in the film, or of the polymer molecules. At the thermal decomposition temperature the functional molecules such as the curing molecules, for instance organic peroxides required for curing, or the primer molecules, for instance silanes, for the adhesion of the film to a glass surface lose their initially specified properties and this should be avoided.

The elastic polymer film 3 is heated on a support surface of support means comprising a fluid between 13 the film and the support surface 12. The film 3 is in one embodiment supported on a fluid bed 13. Preferably, gas such as air, more preferably temperature controlled gas such as air is used as a fluid for the fluid bed 13. Alternatively, a temperature controlled liquid bed 13 can be used. Liquids can for instance be chosen from liquids with a low melting point, a sufficiently high flash punt and a low melting point, which is low enough for the liquid to be in the liquid state at the temperature at which the annealing of the polymer film is carried out, depending on the material of the polymer film 3 to be annealed. Such liquids are for example but not limited to saturated hydrocarbons such as octane, nonane, decane, undecane, dodecane, eicosane, triacontane, of mixtures of those (e.g. paraffin wax). Other liquids can also be of interest in this application: stearine or other oil types such as silicone oil. Every fluid can be used, as long as they can be heated up to a target temperature at which optimal shrink can occur and no negative effects are induced at the surface of the film by adsorption of liquid to the surface of the film 3. The support surface 12 on which the polymer film is heated can be flat or curved.

Figure 5:
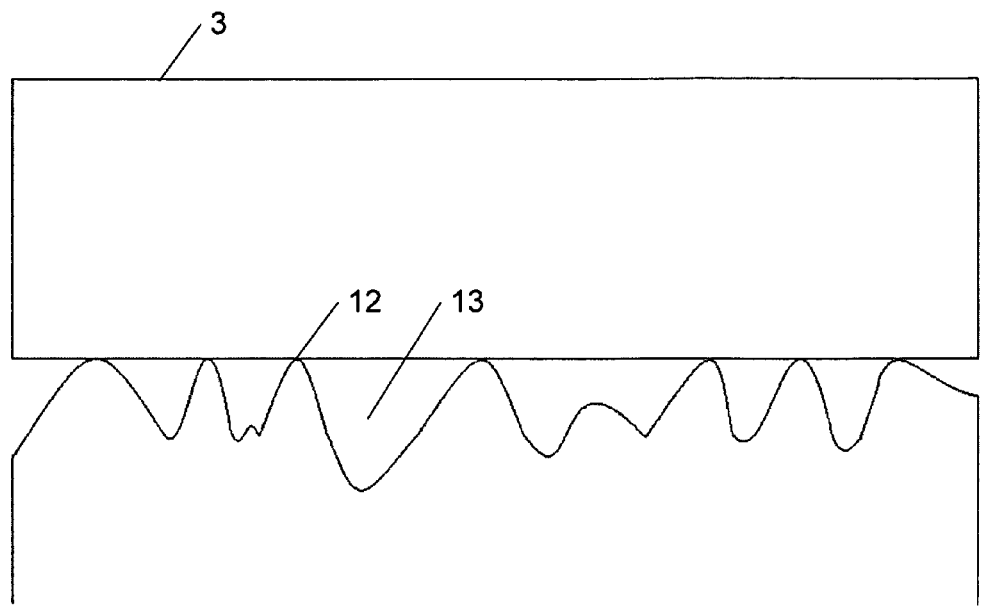
FIG. 5 shows a cross-section of a polymer encapsulation film, supported on a rough surface, according to a preferred embodiment of the current invention.
Figure 6:
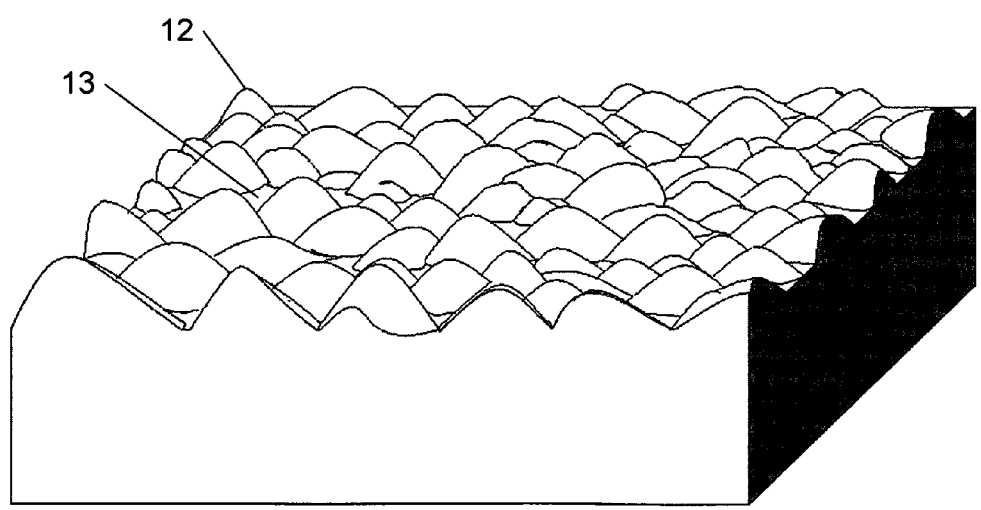
FIG. 6 shows an overview of the rough surface according to FIG. 5.

In a preferred embodiment, such as for example shown in FIGS. 5 and 6, the support surface 12 has a rough surface for supporting the film 3, preferably a rough surface with roughness values Rz ranging from 50 to 120 microns or roughness values Ra ranging from 5 to 50 microns, preferably 5-25 microns, more preferably 10-25 microns. The Rz and Ra values were obtained by a Mitutoyo SJ-201 with a cutoff of 0.8 mm using ISO 4287:1997. By convention every 2D roughness parameter is a capital R followed by additional characters in the subscript. The subscript identifies the formula that was used, and the R means that the formula was applied to a 2D roughness profile. Ra is the arithmetic average of the roughness profile and Rz is the ten-point roughness. A schematic cross-section and an overview of such a rough surface are shown in FIGS. 5 and 6, respectively. The elastic polymer film 3 is supported on discrete points 12 and in combination with the air pockets 13 between the elevations of the rough surface, acting as air cushions, this arrangement prevents the film from sticking, flowing elongating or significantly dimensionally changing in the 3 dimensions during annealing. The distribution of the elevations and depressions according to a random pattern on the surface are believed to contribute to a further increase of the isotropy of the polymer molecules in the film.

The rough surface 12 can be made of any material, but preferably, the rough surface is made of metal. By metal is meant any metal and/or its alloys that is durable, hard, thermally stable enough to be used in the present application. On one hand several metals and/or their alloys can be of interest to be used as a support surface, on the other hand several techniques exist to apply a certain chosen roughness to a surface. The person skilled in the art is able to make the right combination of a suitable metal with a suitable roughening technique. Steel surfaces or stainless steel surfaces for instance meet the requirements for this particular application.

The rough surface 12 is for example a flat surface of any shape. The polymer film can be annealed on the flat surface 12 as a part of a continuous annealing process or in a batch annealing process. The film can be provided to the flat surface by driving means 10, or can be laid on the flat surface or be placed on the surface in any other way. The heating means 8 can be placed above the flat surface 12 on the side supporting the polymer film 3, or underneath the flat surface or both ways.

Preferably, during annealing, the photovoltaic polymer encapsulation film 3, in the form of a continuous sheet, is fed over the support means 12 by driving means 10.

FIG. 3 shows an embodiment in which the polymer film 3 is supported on a flat surface 12, mounted on driving means 10 in this case a conveyor belt 10. The conveyor belt 10 transports the polymer film 3. The polymer film 3 is first heated on the flat surface 12 by heating means 8 to a relaxation temperature and after the film has been annealed, the film is cooled by cooling means 11. The time during which the polymer film 3 is annealed, is a function of the speed of the conveyor belt 10, and can be chosen in function of the desired properties of the annealed film 3, as is discussed below.

FIG. 4 shows a preferred embodiment in which the elastic polymer film 3 is supported on the supporting means 12, specifically a roll with a rough surface 12 as outer cylindrical surface. The roll can either be made to be full or hollow on the inside. Optionally, the roll can be heated from the inside by heating means. In the current embodiment, the extruded film 3 is for instance transported to the roll with a rough surface 12 via a conveyer belt and/or one or more transportation rolls 10, as shown in FIG. 4. The roll can rotate around its longitudinal axis at a rotational speed slow enough for the film 3 to be a least partially annealed but fast enough to achieve a sufficient level of productivity. Optimization of annealing is a function of the relaxation temperature and the time during which the film 3 is exposed to this temperature. For the same percentage of shrink, one can choose different strategies: low temperature and low annealing time or higher temperature and short annealing time. Preferably, to obtain a high throughput, the film 3 can be transported along the heating means at high temperature for the shortest possible annealing time. Yet, too high a temperature is not desired. At high temperatures, the polymer film 3 might become too fluid, making further automated processing of the film 3, for example on rolls 10, difficult and/or induce early curing. For the materials and the film thickness involved in this particular application, a line speed of approximately 10 to 15 meter of polymer film 3 per minute is envisaged.

After heating and annealing the elastic polymer film 3, the film is still hot and can be cooled prior to applying again stress in the machine direction, for example to manipulate the film, by winding the film on a roll.

The annealed film can be cooled in different ways, such as, but not limited to cooling the film in a cooling bath, cooling the film by blowing a cooling gas on the film or cooling the film on a cooling surface. In a preferred embodiment the soft, annealed film 3 is provided to be, preferably, gently laid on a conventional chill roll 11, as illustrated in FIGS. 3 and 4. At or after this stage, additional embossing could be applied, to create certain functional patterns in the film surface.

A continuous process for producing annealed photovoltaic polymer encapsulation film 3 consist usually of the steps of converting an elastic polymer into a annealed film 3 by means of for example polymer extrusion technology, transporting the film 3 on rollers 10 and/or conveyor belts or any suitable means to the annealing unit 7, heating the film 3 supported by a cylindrical roll with a rough surface 12, cooling the film 3 for example on a conventional chill roll 11 and winding the annealed and cooled film 3 on a roll. The residence time of the film 3 at a certain temperature will result in a chosen shrink level of the film 3. The process is also suitable to process batch sheets of un-annealed polymer encapsulation film 3, namely that the polymer encapsulation film 3 can be annealed in line with the extrusion process or off line in a separate roll to roll or roll to sheet operation. This makes it possible to separate the production of the polymer film 3 from the annealing of the polymer film 3. For example can the polymer film 3 be produced at a different location and be supplied to be annealed either in the form of a continuous sheet or as separate batches of polymer film. Preferably, the polymer encapsulation film 3 is transported on rollers 10 or conveyor belts or any suitable combination thereof. The transportation speed is preferably adjusted to be compatible with the annealing process. The polymer encapsulation film 3 is in a preferred embodiment provided in the form of a continuous sheet such that annealed film can be produced in an economically efficient way at a high throughput speed and in an automated production process.

EXAMPLE 1

A film of approximately 450 microns, made of EVA with a VA percentage concentration of 31-33% and a melt point of 61-63° C., containing an organic peroxide curing agent has a original stress of more 55% shrink, when measured in a free floating condition before relaxation, using the water bath test method described below at 80° C.

In the water bath test method, a piece of EVA film (100× 100 mm) is put in a hot water bath at a temperature of 80° C. This temperature is above the melting temperature of EVA. At this temperature, the film will float freely on the water surface. After approximately 25 seconds the shrink has occurred. The film is taken out of the bath using a sieve like device and chilled (quenched) in a second bath at ambient temperature. Finally, the dimensions of the film are recorded. The shrink is expressed in percentage of residual length along the machine direction with respect to the original length of the film, namely 100 mm. A low shrink film has therefore the highest percentage residual length.

The same film, processed in an annealing unit at an elevated temperature of 68 to 69° C. for 39 seconds for example, results in 15% shrink.

The annealing unit in this case comprises a near wave infrared emitter system, including power management and a pyrometer to control temperature and thus the heating of the film by giving feedback to the power management device. Simultaneously, the film was laid on a conveyor system, using a rough steel surface, having an Rz roughness of ~85 to 90 microns, whilst holding the support/conveyor system at an elevated temperature using a closed water circuit based heating system to heat and hold the conveyor system at approximately 68 to 69° C. Although the film is in this state very sticky, no sticking occurred to the rough surface. The film could be handed over to a cooling device chilling the film to 25° C., without elongating the film although it is still at high temperature in a soft and liquid state. The cooling device is a conventional water based chill roll.

EXAMPLE 2

The same film as in example 1 was heated up to 66° C. only. Now the film is much easier to manipulate and still has a certain melt strength. To achieve the same effective annealing (<15 mm shrink) now the time needed at elevated temperature is 93 seconds. The influence of the temperature on the speed of annealing appeared to be exponential.

EXAMPLE 3

The same film as in example 1 was also annealed for 39 seconds at only 66° C. Now the shrink was 35 mm.

EXAMPLE 4

The same film as in examples 1, 2 and 3 was annealed according to method 1 at 68 to 69° C., using a different organic peroxide system (a combination of two organic peroxide esters). The same shrink results were obtained. The shrink appears to be independent of the organic peroxide type.

The invention claimed is:

1. A process for annealing photovoltaic polymer encapsulation film, comprising the steps of
producing a photovoltaic polymer encapsulation film made of a functionalized polyolefin of the type ethylene vinylacetate (EVA) by extrusion along an extrusion direction, the film comprising polymer molecules oriented along a machine direction along the extrusion direction and
annealing the thus obtained photovoltaic polymer encapsulation film by feeding the film in the form of a continuous sheet over a support surface of a support means, and wherein a fluid is comprised between the film and the support surface and heating the film by infra red heating to a relaxation temperature to increase the isotropy of polymer molecules such that the film is at least partly annealed, wherein the surface of the support means has a roughness Rz between 50 and 120 microns, and a roughness Ra between 5 and 50 microns.

2. The process according to claim 1, wherein the rough surface is made of metal.

3. The process according to claim 2, wherein the support means comprise a roll with the rough surface as outer cylindrical surface and wherein the infra-red heating is provided by infra-red heating elements placed radially along the outer surface of the cylindrical surface.

4. The process according to claim 1, wherein the film comprises functional molecules and the relaxation temperature is below the thermal decomposition temperature of the functional molecules.

5. The process according to claim 1, wherein the relaxation temperature is at least above the vicat softening point.

6. The process according to claim 1, wherein during annealing, the photovoltaic polymer encapsulation film, in the form of a continuous sheet, is fed over the support means by driving means.

7. The process according to claim 6, wherein the photovoltaic polymer encapsulation film is fed over the support means at a speed of 8 m/min or higher.

8. The process according to claim 1, wherein the EVA has a vinyl-acetate concentration between 28% and 40%.

9. The process according to claim 1, wherein the fluid is air.

10. The process according to claim 1, wherein the support means comprise a roll with a rough surface made of metal as outer cylindrical surface,
wherein the infra-red heating is provided by infra-red heating elements placed radially along the outer surface of the cylindrical surface,
wherein the film comprises functional molecules and the relaxation temperature is below the thermal decomposition temperature of the functional molecules and above the vicat softening point;
wherein during annealing, the photovoltaic polymer encapsulation film, in the form of a continuous sheet, is fed over the support means by driving means at a speed of 8 m/min or higher; and
wherein the EVA has a vinyl-acetate concentration between 28% and 40%.

11. The process according to claim 10, wherein the fluid is air.

12. A process for assembling solar cell arrays (4) into photovoltaic modules (1) by encapsulating the solar cell arrays (4) with a photovoltaic encapsulation film (3), obtained by a process according to any one of the claims 1-11.

* * * * *